(12) United States Patent
Song et al.

(10) Patent No.: US 11,165,394 B2
(45) Date of Patent: Nov. 2, 2021

(54) TRANSIMPEDANCE AMPLIFIER FOR CONVERTING ELECTRICAL CURRENTS TO VOLTAGES

(71) Applicant: Nvidia Corporation, Santa Clara, CA (US)

(72) Inventors: Sanquan Song, Santa Clara, CA (US); John Poulton, Durham, NC (US); Carl Thomas Gray, Durham, NC (US)

(73) Assignee: Nvidia Corporation, Santa Clara, CA (US)

( * ) Notice: Subject to any disclaimer, the term of this patent is extended or adjusted under 35 U.S.C. 154(b) by 68 days.

(21) Appl. No.: 16/778,895

(22) Filed: Jan. 31, 2020

(65) Prior Publication Data
US 2021/0242837 A1   Aug. 5, 2021

(51) Int. Cl.
  *H03F 3/08* (2006.01)
  *H03F 1/08* (2006.01)
  *H03F 1/26* (2006.01)

(52) U.S. Cl.
  CPC ............ *H03F 1/086* (2013.01); *H03F 1/26* (2013.01); *H03F 2200/372* (2013.01)

(58) Field of Classification Search
  CPC ..................... H03F 3/08; H03F 3/082

USPC ...................... 330/308; 250/214 A
See application file for complete search history.

(56) References Cited

U.S. PATENT DOCUMENTS

| 7,423,483 B1 * | 9/2008 | Voo ........................ H03F 1/08 330/109 |
| 8,891,704 B2 | 11/2014 | McLeod et al. | |

FOREIGN PATENT DOCUMENTS

DE          3607688 A1 *  9/1987  ........... H03G 1/0047

* cited by examiner

*Primary Examiner* — Steven J Mottola (57) ABSTRACT

The disclosure provides an improved transimpedance amplifier (TIA) that can operate at a higher bandwidth and lower noise compared to conventional TIAs. The TIA employs a data path with both feedback impedance and feedback capacitance for improved performance. The feedback impedance includes at least two resistors in series and at least one shunt capacitor, coupled between the at least two resistors, that helps to extend the circuit bandwidth and improve SNR at the same time. The capacitance value of the shunt capacitor can be selected based on both the bandwidth and noise. In one example, the TIA includes: (1) a biasing path, and (2) a data path, coupled to the biasing path, including multiple inverter stages and at least one feedback capacitance coupled across an even number of the multiple inverter stages. An optical receiver and a circuit having the TIA are also disclosed.

16 Claims, 6 Drawing Sheets

TRANSIMPEDANCE AMPLIFIER FOR CONVERTING ELECTRICAL CURRENTS TO VOLTAGES

TECHNICAL FIELD

This application is directed, in general, to converting current to voltage and, more specifically, to increasing the bandwidth and reducing the noise of a transimpedance amplifier.

BACKGROUND

Integrated photonics are being used in various industries including telecommunications and data communications. In contrast to electronic integrated circuits, integrated photonics use light for data communication and signal processing. Thus, instead of communicating via electrical signals over a conductor, either on a board or through a package, various communication systems are communicating data via light. For example, a transmitter of an optical communication system can modulate a light source, such as a laser, to transmit logical ones and zeros. A receiver of the optical communication system can receive the transmitted light that includes the optical data of ones and zeros and convert the received light into electrical signals representing the ones and zeros. A photo detector of the optical receiver can be used to detect and convert the transmitted light into electrical current for further processing. Other components of the optical receiver, or connected to the optical receiver, can be used to convert the electrical current to voltages and determine if a zero or one was transmitted.

SUMMARY

In one aspect, the disclosure provides a transimpedance amplifier (TIA). In one example, the TIA includes: (1) a biasing path, and (2) a data path, coupled to the biasing path, including multiple inverter stages and at least one feedback capacitance coupled across an even number of the multiple inverter stages.

In another aspect, the disclosure provides a circuit. In one example, the circuit includes: (1) a processor, and (2) a transimpedance amplifier (TIA), coupled to the processor, including a data path having multiple inverter stages and at least one feedback capacitance coupled across an even number of the multiple inverter stages.

In yet another aspect, the disclosure provides an optical receiver. In one example, the optical receiver includes: (1) a photodetector, and (2) a transimpedance amplifier (TIA) coupled to the photodetector and including a data path having multiple inverter stages and at least one feedback capacitance coupled across an even number of the multiple inverter stages.

In still another aspect, the disclosure provides a method of operating an optical receiver having a TIA. In one example, the method includes: (1) receiving optical data, (2) converting the optical data to an electrical current, and (3) converting the electrical current to an electrical voltage employing the TIA, wherein the converting includes extending a bandwidth of the TIA and increasing a SNR of the TIA employing feedback impedance, and further increasing the bandwidth of the TIA employing feedback capacitance.

BRIEF DESCRIPTION

Reference is now made to the following descriptions taken in conjunction with the accompanying drawings, in which.

DETAILED DESCRIPTION

A trans-impedance amplifier (TIA) is a component of an integrated photonic system that is often used to convert detected light to an electrical signal. TIA's are used to convert a low ampere signal, such as produced by a receiver photodiode, into a voltage signal for a sensing amplifier. For example, a TIA can convert a ten microampere range current produced by a receiver photodiode into a hundred millivolt range voltage with limited noise power required by a follow-on sense amplifier for a target $10^{-12}$ bit-error-rate (BER). Since the light energy from the detected light is typically small and the conversion ratio of the photodiode is relatively weak, a TIA with a high input impedance is usually employed. Additionally, since the current is very small, the components of the TIA are not only amplifying the input current but are also contributing noise to the signal in a similar order of the input current.

Accordingly, designers of TIA's deal with a gain-bandwidth trade-off: a lower bandwidth results in better signal-to-noise ratio (SNR) but a worse inter-symbol interference (ISI), while a higher bandwidth results in a lower SNR but a better ISI. Additionally, TIA designers also have to consider that the bandwidth of the photodiode output node is typically the bottle neck of an integrated photonic system.

The disclosure provides an improved TIA that can operate at a higher bandwidth and lower noise compared to conventional TIAs. The disclosed TIA employs a data path with both feedback impedance and feedback capacitance for improved performance. Each feedback impedance includes at least two resistors in series and at least one shunt capacitor coupled between the at least two resistors. The shunt capacitor helps to extend the circuit bandwidth and improve SNR at the same time. The capacitance value of the shunt capacitor can be selected based on both the bandwidth for the TIA and also the noise. A greater emphasis can be placed on noise of the TIA when selecting the shunt capacitor since the TIA also employs feedback capacitance. Each feedback capacitance includes a capacitor that helps increase the bandwidth of the TIA, which can be represented by the transfer function between the input current of the TIA to the output voltage of the TIA. The feedback capacitance can be inserted at every two inverters stages of the TIA or at other even numbered combinations of inverter stages. In addition to the above components that form a data path of the TIA, the disclosed TIA also includes a biasing path that cancels, or at least reduces, the DC part of the TIA's input current so that the data path of the TIA operates with an optimal gain and bandwidth point. The biasing path can include an inverter, an RC filter and an NMOS device.

Figure 3:
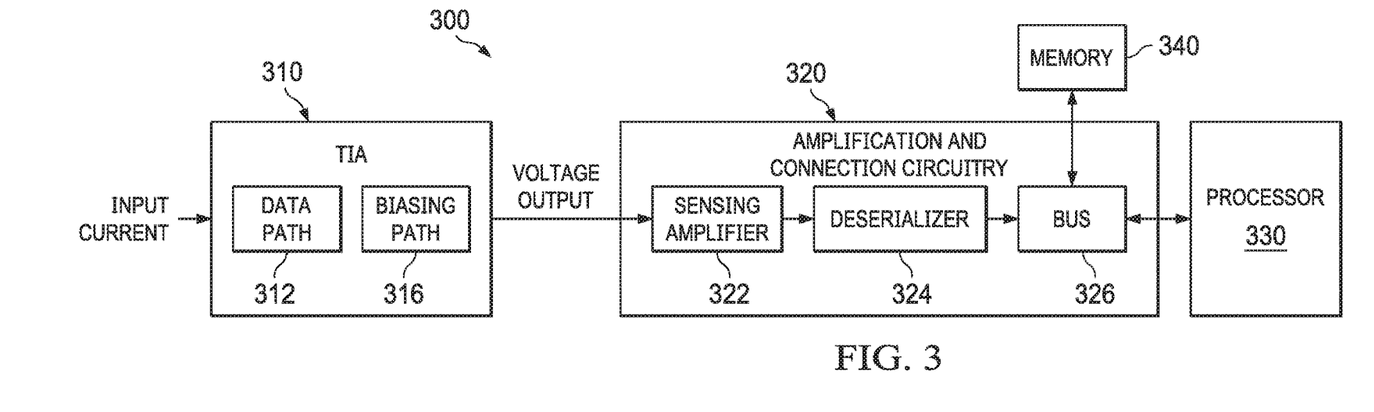
FIG. 3 illustrates a block diagram of an example of a circuit that includes a TIA constructed according to the principles of the disclosure.
Figure 4:
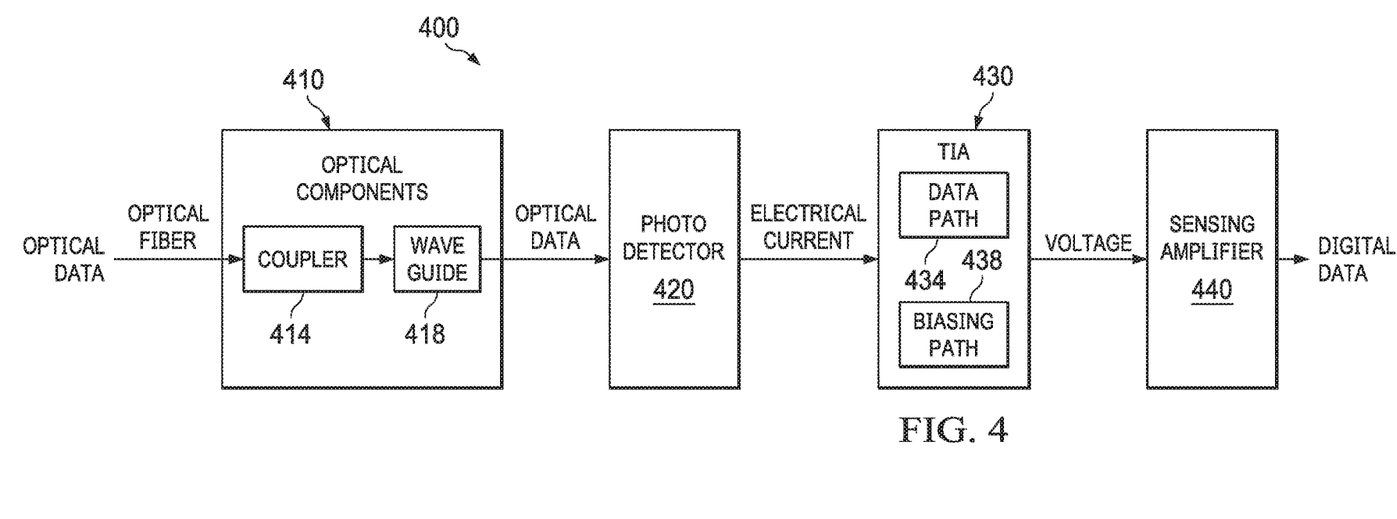
FIG. 4 illustrate a block diagram of an example of an optical receiver having a TIA constructed according to the principles of the disclosure.

The TIA can be used to convert the current output of various types of sensors, such as a photo detector, an accelerometer, or a Geiger-Muller tube, to a useable voltage. The TIA can be used in various circuits including integrated photonics. In various examples, the TIA can be coupled to a processor through amplification and connection circuitry, and can be part of an optical receiver. FIG. 3 provides an example of a TIA coupled to a processor and FIG. 4 provides an example of an optical receiver having a TIA. In each of these examples, the TIA can be integrated on the same chip with various other components to form a package, such as a GPU package, or can be located off-chip and connected to other components. The disclosed TIA can be part of an optical communication system employed in various applications, including communicating data between devices of a data center.

Figure 1:
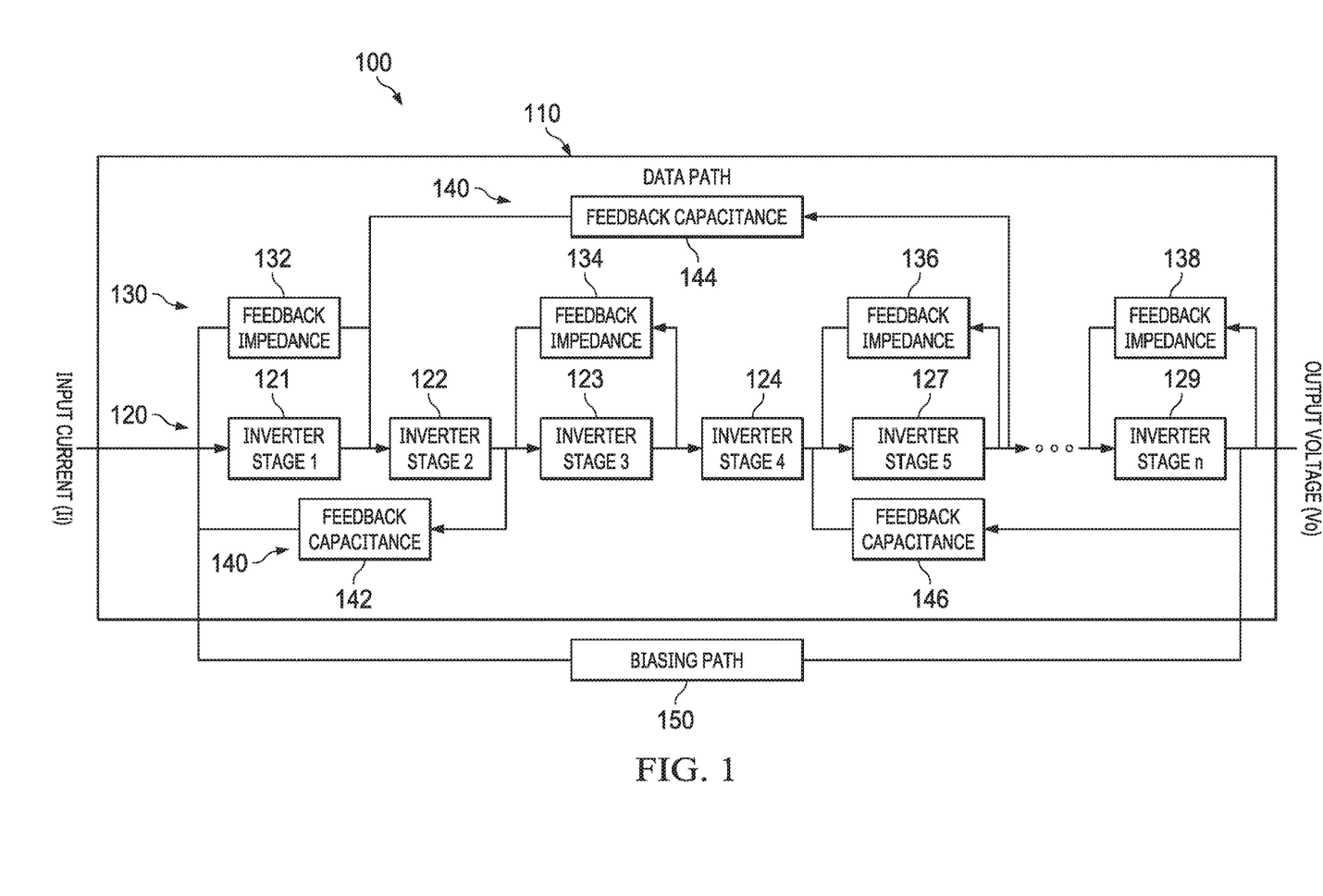
FIG. 1 illustrates a block diagram of an example of a TIA constructed according to the principles of the disclosure.

FIG. 1 illustrates a block diagram of an example of a TIA 100 constructed according to the principles of the disclosure. The TIA 100 receives an input current Ii and converts the input current to an output voltage Vo. The input current can be generated by a sensor, such as a photo detector. The input current Ii can be in microamperes, such as in a ten to twenty microampere range that is typically produced by a receiver photodiode. The output voltage Vo produced by the TIA 100 can be in a 100 to 300 millivolt range and can be provided to another device, such as a sensing amplifier, for additional processing. The TIA 100 includes a data path 110 and a biasing path 150. The data path 110 has an odd number ("n") of inverter stages 120 coupled in series, feedback impedance 130, and feedback capacitance 140. Though not illustrated in FIG. 1, the data path 110 and the biasing path 150 are coupled between an operating voltage and ground.

The inverter stages 120 are configured to amplify and convert the input current Ii to the output voltage Vo. The inverter stages 120 include individual inverter stages 121, 122, 123, 124, 127, and 129. The first inverter stage 121 can receive the input current and convert the input current into a voltage. The subsequent inverter stages 122, 123, 124, 127, and 129, cooperate to amplify the created voltage to the output voltage Vo. The inverter stages 120 can be discrete circuits, such as two transistors coupled in series between the operating voltage and ground. For example, the inverter stages 120 can include a positive-channel metal-oxide semiconductor (PMOS) transistor coupled to a negative-channel metal-oxide semiconductor (NMOS) transistor, such as the inverter stages of FIG. 2.

The feedback impedance 130 assists in extending the bandwidth and improving the SNR of the TIA 100. The feedback impedance 130 includes individual feedback impedance 132, 134, 136, and 138. Each of the odd numbered inverter stages 120 (i.e., alternating inverters) of the data path 110 has an individual stage of the feedback impedance 130. As such, coupled across inverter stage 121 is feedback impedance 132, across inverter stage 123 is feedback impedance 134, across inverter stage 127 is feedback impedance 136, and coupled across inverter stage 129 is feedback impedance 138. Each individual stage of the feedback impedance 130 can include at least two resistors coupled together in series and at least one shunt capacitor coupled between the at least two resistors. The shunt capacitors for each of the stages of the feedback impedance 130 can extend the bandwidth of the TIA 100 and improve the SNR.

The feedback capacitance 140 increases the bandwidth of the TIA 100. The feedback capacitance 140 includes individual feedback capacitance 142, 144, and 146, that are coupled across an even number of the inverter stages 120 of the data path 110. For example, across inverter stages 121 and 122 is feedback capacitance 142, and across inverter stages 122, 123, 124, and 127, is feedback capacitance 144. Feedback capacitance 146 is coupled across inverter stages 127 to 129.

The biasing path 150 is coupled to the input of the TIA 100 and the output of the TIA 100 (i.e., coupled across the TIA 100). The biasing path 150 is configured to cancel the DC part of Ii so that the data path 110 operates with the best gain and bandwidth point. The biasing path 150 can include an inverter, an RC filter and an NMOS device, such as biasing path 250 of FIG. 2.

Figure 2:
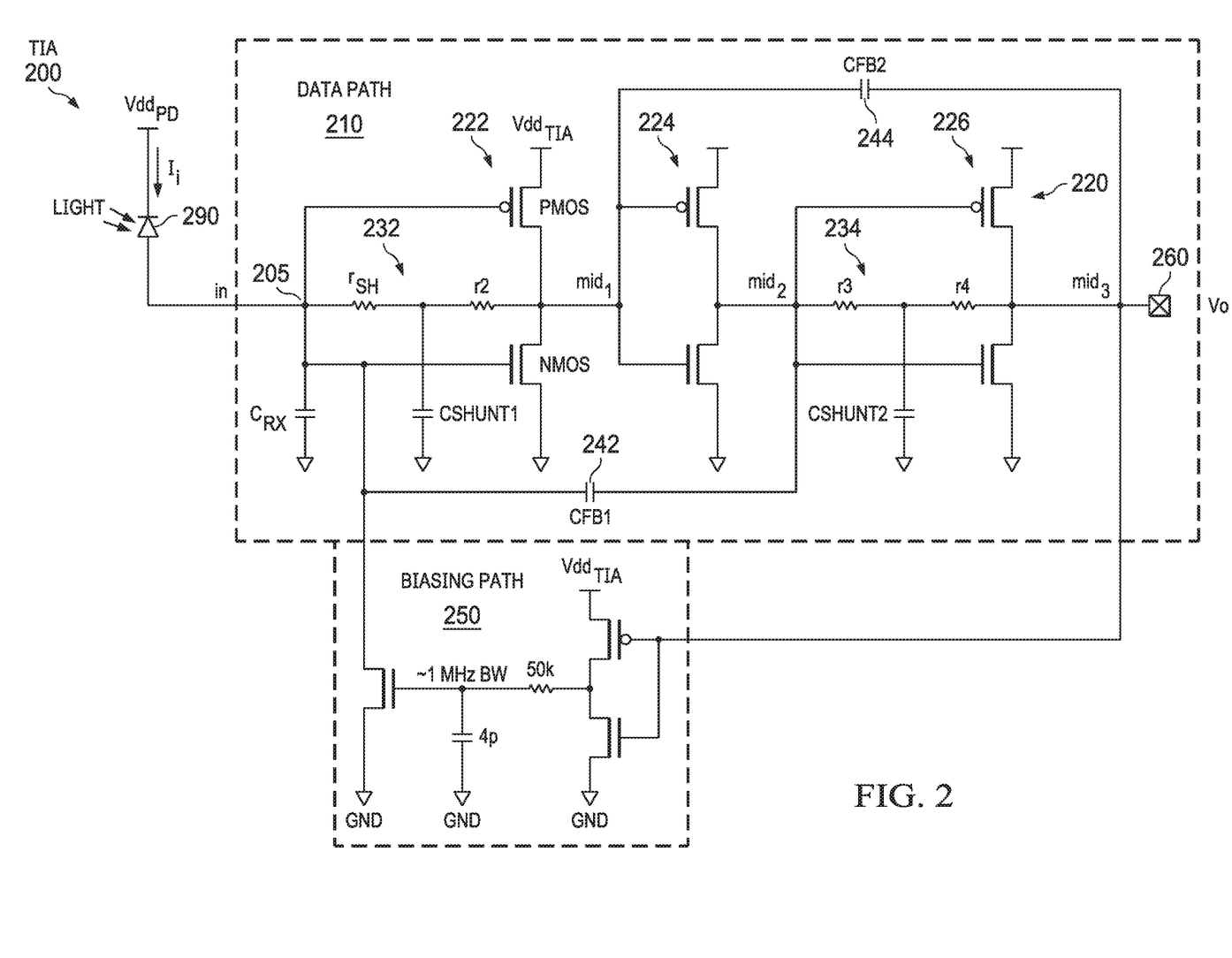
FIG. 2 illustrates a schematic diagram of an example of a TIA constructed according to the principles of the disclosure.

FIG. 2 illustrates a schematic of an example of a TIA 200 constructed according to the principles of the disclosure. The TIA 200 is shown coupled to a photodiode 290 that provides an input current to the TIA 200. The TIA 200 and the photodiode 290 can be part of an optical receiver. The TIA 200 has a data path 210 that includes three inverter stages, collectively referred to as inverter stages 220, and a biasing path 250. The inverter stages 220 include a first inverter stage 222, a second inverter stage 224, and a third inverter stage 226. The inverter stages 220 include a PMOS transistor coupled in series between the operating voltage of the TIA 200 ($Vdd_{TIA}$) and ground (GND). $Vdd_{TIA}$ can be in the range of 0.7 volts to 1.1 volts, and can differ from the operating voltage of the photodiode 290 ($Vdd_{PD}$).

The first inverter stage 222 and the third inverter stage 226 have feedback impedance 232, and feedback impedance 234, respectively. Each of the feedback impedances 232, 234, includes two resistors coupled in series and a shunt capacitor $C_{SHUNT}$ coupled between the two resistors. The resistors and shunt capacitor of feedback impedance 232 are denoted as $r_{SH}$, $r_2$, and $C_{SHUNT1}$, and the resistors and shunt capacitor of feedback impedance 234 are denoted as $r_3$, and $r_4$, and $C_{SHUNT2}$. Coupled across the first and second inverter stages 222, 224, is a feedback capacitance 242, shown as $C_{FB1}$. A feedback capacitance 244, illustrated as $C_{FB2}$, is coupled across the second and third inverter stages, 244, 246.

Coupled across all of the inverter stages 220 is the biasing path 250. The biasing path 250 is configured to reduce or cancel the DC part of Ii so that the data path 210 operates at an optimal gain and bandwidth point. The biasing path 250 includes an inverter having PMOS and NMOS transistors, an RC filter and an NMOS device, e.g., an NMOS transistor. The values of the resistor and the capacitor of the RC filter can be, for example, 50 k ohms and 4p Farads. The inverter of the biasing path is coupled to the output terminal 260 and the NMOS device of the biasing path 250 is coupled to the input terminal 205. A bandwidth 1 MHz is shown in FIG. 2 but other bandwidths can also be sufficiently low enough to filter out the frequency component of Vo. For example, the bandwidth can be in a range of 0.5 MHz to 2 MHz. An input capacitance at the input terminal 205 is represented by $C_{RX}$, which corresponds to the parasitic capacitance of the photodiode 290, bump, wiring and frontend of the TIA 200.

Also coupled to the input terminal 205 is the photodiode 290. The photodiode 290 receives light, generates the electrical current Ii corresponding to the received light, and provides the electrical current Ii to the input terminal 205. The light can represent serial data transmitted from another device coupled to the TIA 200. The input current Ii can be in a ten to twenty microampere range. The output voltage Vo produced by the TIA 200 from the input current Ii can be in a 100 to 300 millivolt range. The output voltage Vo is provided at the output terminal 260.

The shunt capacitors $C_{SHUNT1}$ and $C_{SHUNT2}$ of feedback impedances 232, 234, assist in improving the bandwidth and the SNR of the TIA 200. The shunt capacitor $C_{SHUNT1}$ of the first inverter stage 222 can be employed to affect the overall SNR performance of the TIA 200. At low frequency, the shunt capacitor of the first inverter stage can be treated as open and the feedback impedance 232 degenerates into the feedback resistors $r_{SH}$ and $r_2$ coupled to the midpoint ($mid_1$) of the PMOS and NMOS transistors of the first inverter stage 222. At this point the input impedance is about $2r_{SH}/(A1+1)$, where A1 is the DC gain of the first inverter stage 222 and $r_2=r_{SH}$. At high frequency, the shunt capacitor $C_{SHUNT1}$ can be treated as a short, conducting all of the input current to ground. Therefore, the input impedance provided by the feedback impedance 232 at high frequency is essentially from $r_{SH}$. Assuming that A1 is greater than 1, a peaking filter is created and the circuit bandwidth for the TIA 200 is improved.

Since $C_{SHUNT1}$ shorts $I_i$ to ground at high frequency, a voltage signal $v(in)=r_{SH}I_i$ is created, which is converted into currents into node $mid_1$ through the transconductance of the PMOS ($g_{mp}$) and NMOS ($g_{mn}$) transistors: $g_{mp}r_{SH}I_i$ and $g_{mn}r_{SH}I_i$, respectively. Thus, the total signal current that flows into $mid_1$ at high frequency can be higher than at low frequency as long as $(g_{mp}+g_{mn}) r_{SH}$ is greater than 1.

Though the signal at $mid_1$ of the first inverter stage 222 is boosted significantly by the gain factor $(g_{mp}+g_{mn}) r_{SH}$, the noise level can increase mildly. There are three direct noise sources and one indirect noise source at the node $mid_1$. The direct noise sources include the two transistors, the PMOS and NMOS transistors, and the resistor r2 that are directly tied to $mid_1$. The noise power spectrum density of these three components is about the same as the circuit discussed above when the shunt capacitor $C_{SHUNT1}$ is treated as open at low frequency, as the transistor noise from the PMOS and NMOS transistors dominates. A high frequency is close to the Nyquist frequency of the data stream. For example, a high frequency can be close to 12.5 GHz for a 25 Gbps data stream. The indirect noise source is the resistor $r_{SH}$ tied to v(in) at the input terminal 205, which could generate more power than all the direct sources combined because of the gain factor $(g_{mp}+g_{mn}) r_{SH}$. Assuming that $(g_{mp}+g_{mn}) r_{SH}$ is much greater than 1, the output SNR is determined by the signal level of $I_i$ and noise level of $r_{SH}$, which can lead to better SNR performance than a conventional TIA.

To improve the SNR even further, an $r_{SH}$ of a greater resistance value can be employed, which also reduces the bandwidth. However, because of peaking effect from the peaking filter, the bandwidth can still be higher than a conventional TIA and have a much better SNR performance. Example values for $r_{SH}$ and $C_{SHUNT1}$ are $r_{SH}=1.5$ k ohms and $C_{SHUNT1}=1$ fF.

As the bandwidth of the TIA 200 increases with the help of the shunt capacitor $C_{SHUNT1}$, the total noise power at v(mid1) grows. However, assuming that the input signal power spectrum is white after aliasing till Nyquist frequency (meeting Nyquist ISI Criterion), the total signal power at v(mid1) grows at a higher rate than the noise power along with bandwidth extension. Therefore, the SNR improves with higher bandwidth settings. The same approach can be applied to the feedback resistor $r_3$ of feedback impedance 234 of the third inverter stage 226 with similar bandwidth improvement but less noise benefit due to the nature of noise figure.

The feedback capacitance across an even number of inverter stages of the TIA 200, such as feedback capacitance 242 and 244, provides positive feedback mechanism at AC, which helps to extend the bandwidth of the TIA 200. For example, as v(in) increases at the input terminal 205, voltage at the midpoint $mid_2$ of the PMOS and NMOS transistors of the second inverter stage 224, $v(mid_2)$, increases with a gain factor of $A_1A_2$, where $A_1$ and $A_2$ are the gain of the first and the second inverter stages 222, 224, respectively. Therefore, the effective capacitance of $C_{FB1}$ to node v(in) is about $(1-A_1A_2)C_{FB1}$, which is negative and compensates for input capacitance $C_{RX}$ if $C_{FB1}$ is set around $C_{RX}/(A_1A_2-1)$. For example, assuming $C_{RX}$ to be around 100 fF for a typical photodiode and bonding approach, an area efficient $C_{FB1}$ of 1 fF is used with $A_1A_2$ around 100. Example capacitance values for TIA 200 are also provided with the simulation graphs illustrated in FIG. 6, wherein the example values are a contour with $C_{FB}$ swept as one parameter.

A potential risk associated with capacitance feedback is oscillation, since oscillation can potentially occur with a large setting of $C_{FB1}$ and $C_{FB2}$. Another related concern is noise. Different from the shunt capacitors $C_{SHUNT1}$ and $C_{SHUNT2}$, the feedback capacitors $C_{FB1}$ and $C_{FB2}$ boost the bandwidth of the TIA 200 with reduced SNR. As such, a capacitance value of the $C_{FB1}$ and $C_{FB2}$ is selected based on a balance between SNR and ISI. The balance can be based on the application of the TIA 200, i.e., the type of circuit the TIA 200 will be employed. The values for $C_{FB1}$ and $C_{FB2}$ can be the same or can be different.

FIG. 3 illustrates a block diagram of an example of a circuit 300 that includes a TIA 310 constructed according to the principles of the disclosure. The TIA 310 can be configured to operate as, for example, the TIA 100 or TIA 200. The circuit 300 can be the receiver portion of a Serializer/Deserializer (SerDes) interface that receives serial data and converts the serial data to parallel data. In addition to the TIA 310, the circuit 300 includes amplification and connection circuitry 320, a processor 330, and a memory 340, collectively referred to as the components of TIA 310. The components of TIA 310 can be coupled together via conventional connections and can be integrated on a single chip. For example, the processor 330 can be a GPU and all of the components can be part of a GPU package. In other examples, the components of the TIA 300 can be distributed on more than one chip.

The TIA 310 is configured to convert an input current to a voltage output. The input current can be from, for example, a photodiode such as photodiode 290 of FIG. 2. TIA 310 includes a data path 312 and a biasing path 316. The data path 312 is configured to receive the current input, convert the current input to a voltage, and amplify the voltage through various inverter stages to provide the voltage output. Accordingly, the data path 312 includes multiple inverter stages for amplifying and at least one feedback capacitance coupled across an even number of the multiple inverter stages. The feedback capacitance assists in extending the bandwidth and improving the SNR of the TIA 310. The data path 312 can be configured to operate as the data path 110 or data path 210 as disclosed herein.

The biasing path 316 is included to cancel the DC part of the input current to allow the data path 312 to operate with an optimal gain and bandwidth point. The biasing path 316 can include an inverter, an RC filter and an NMOS device, such as the biasing path 150 or the biasing path 250 of FIGS. 1 and 2.

The amplification and connection circuitry 320 is configured to receive the output voltage of the TIA 310, amplify the received output voltage to provide an amplified voltage, and distribute the amplified voltage to the processor 330 and the memory 340. The amplification and connection circuitry 320 includes a sensing amplifier 322, a deserializer 324, and a bus 326.

The sensing amplifier 322 receives the voltage output from the TIA 310 and amplifies the received output voltage to a recognizable logic level representing a one or a zero. The sensing amplifier 322 can determine the logic level by using a reference voltage with the voltage output from the TIA 310. Alternatively, the sensing amplifier 322 can compare the output voltage of different inverter stages of the data path 312 to determine a logic level. Using TIA 200 as an example, the sensing amplifier 322 can compare the voltage at mid2 to output voltage Vo at mid3 of the data path 210 to determine a logic level.

The deserializer 324 receives the series of logic levels determined by the sensing amplifier 322 and converts the serial data into parallel data. The parallel data is provided to the bus 326 for parallel communication. The processor 330 and the memory 340 are coupled to the bus 326 and can receive the parallel data via the bus 326. The processor 330 and the memory 340 can also communicate via the bus 326. The processor 330 can be a parallel processor such as employed in a GPU, a serial processor, such as a CPU. In one example, the processor 330 can be part of a data center.

FIG. 4 illustrates a block diagram of an example of an optical receiver 400 having a TIA constructed according to the principles of the disclosure. The optical receiver 400 can be part of an optical communication system that communicates, i.e., transmits and sends, optical data. The optical receiver 400 includes optical components 410, a photo detector 420, a TIA 430, and a sensing amplifier 440.

The optical components 410 provide an optical interface for receiving optical data and directing the optical data to the photo detector 420. The optical components 410 include a coupler 414 and an optical waveguide 418. The coupler 414 receives the optical data, such as via an optical fiber, and provides the received optical data to the waveguide 418. The waveguide 418 guides the received optical data to the photo detector 420. The photo detector 420 receives the optical data from the waveguide 418 and converts the optical data into electrical current. The photo detector 420 can be a photodiode, such as the photodiode 290 of FIG. 2. The optical components 410 and the photo detector 420 can be conventional components typically found in an optical communication system.

The TIA 430 is configured to receive the electrical current from the photo detector 420 and convert the electrical current into an output voltage. The TIA 430 can be configured to operate as the TIAs disclosed herein, such as TIA 100 and TIA 200. Accordingly, the TIA 430 includes a data path 434 and a biasing path 438. The output voltage produced by the TIA 430 is provided to the sensing amplifier 440.

The sensing amplifier 440 amplifies the output voltage from the TIA 430 to a recognizable logic level representing a one or a zero. The sensing amplifier 440 can determine a logic level by using a reference voltage or by comparing voltages of two different inverter stages of the data path 434. The sensing amplifier 440 outputs digital data that can then be further processed, such as by a deserializer like deserializer 324 of FIG. 3. The sensing amplifier 440 can also be a conventional component typically employed in an optical receiver.

Figure 5:
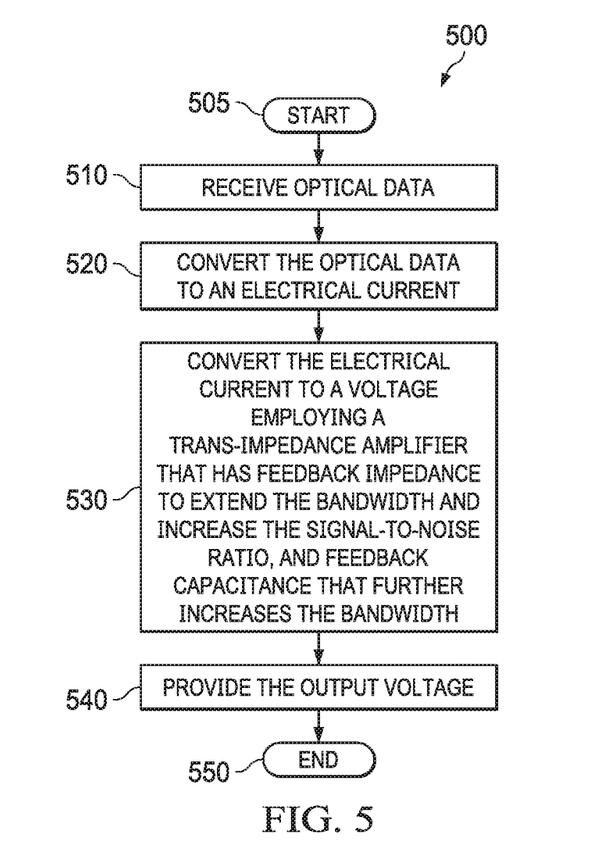
FIG. 5 illustrates a flow diagram of an example of a method of operating an optical receiver, having a TIA such as disclosed herein, carried out according to the principles of the disclosure.

FIG. 5 illustrates a flow diagram of an example of a method 500 of operating an optical receiver, having a TIA, carried out according to the principles of the disclosure. The optical receiver can be the optical receiver of FIG. 4 and the TIA can be, for example, TIA 100 or TIA 200. The method 500 begins in a step 505.

In a step 510, optical data is received. The optical data can be modulated light that is received via an optical fiber of an optical communication system. In some examples, the optical data is a stream of bits or bytes that were converted to serial data from parallel data. The optical data can be received via optical components coupled to the fiber.

The received optical data is converted into an electrical current in a step 520. A photo detector, such as a photodiode, can be employed for the conversion from light to the electrical current. The photo detector can receive the optical data from the optical components.

In a step 530, the electrical current is converted to a voltage employing a TIA. Converting the current into voltage includes extending the bandwidth of the TIA and increasing the SNR of the TIA employing feedback impedance. Additionally, the converting includes further increasing the bandwidth of the TIA employing feedback capacitance. Alternating inverter stages of the TIA can include feedback impedance for extending the TIA bandwidth and increasing the TIA SNR. Additionally, the feedback capacitance can be coupled across an even number of the TIA inverter stages. The converting can also include reducing a DC component of the electrical current employing a biasing path of the TIA. The TIA can be, for example, one of the TIAs disclosed herein.

The voltage generated by the TIA is provided as an output voltage in a step 540. The output voltage can be provided to a sensing amplifier for amplification and generation of logic levels. The logic levels can then be provided to a deserializer and a bus for converting to parallel data and distributing to coupled devices or components. The method 500 then continues to step 550 and ends.

Figure 6:
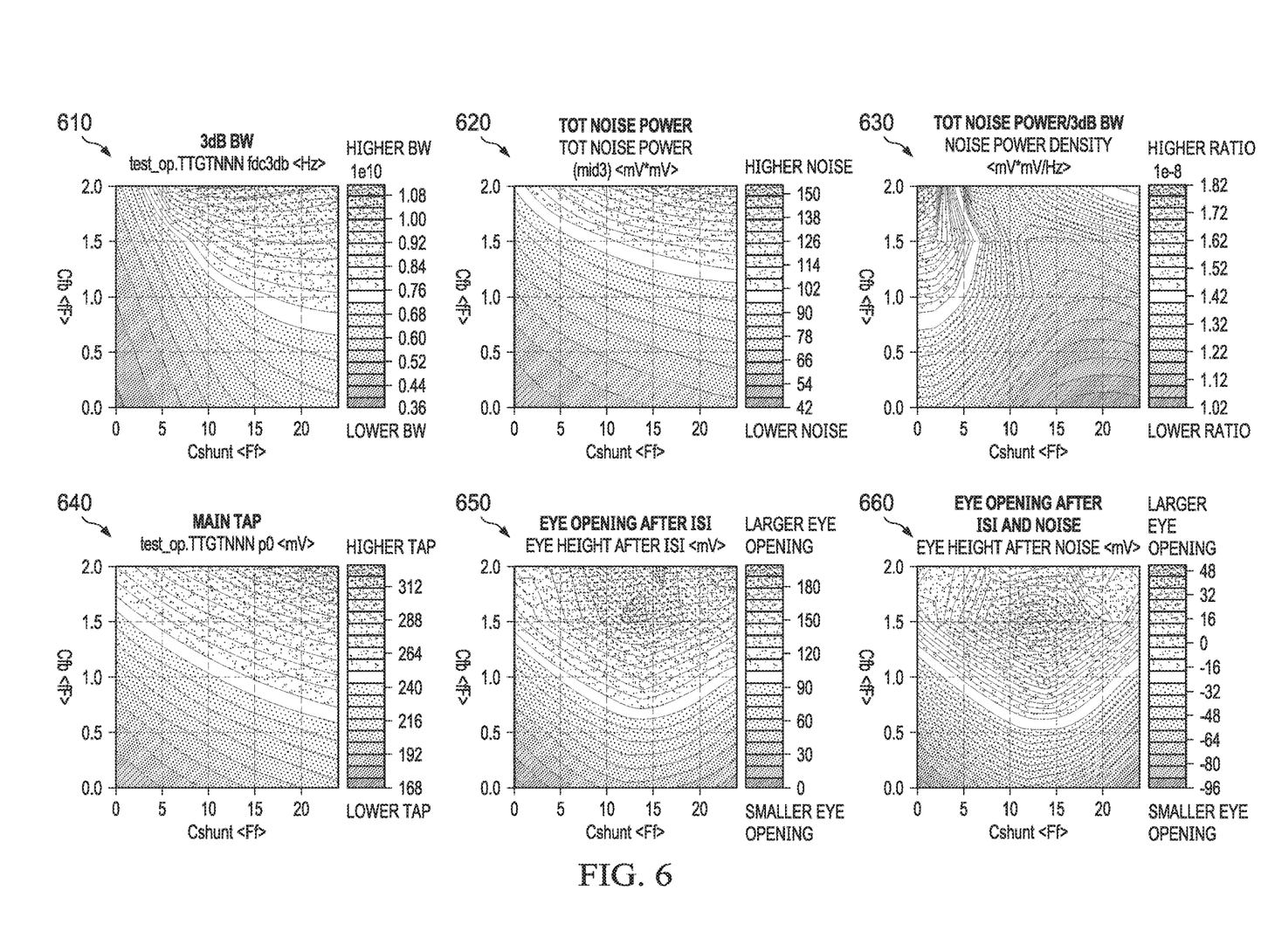
FIGS. 6-8 illustrate the results of simulating the operation of the example TIA of FIG. 2.
Figure 7:
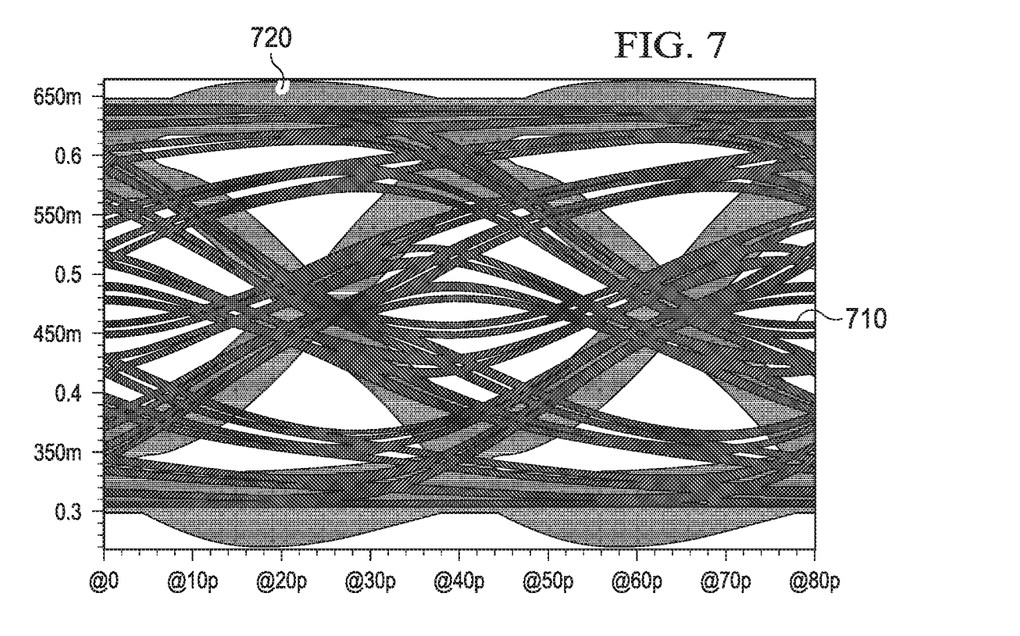
Figure 8:
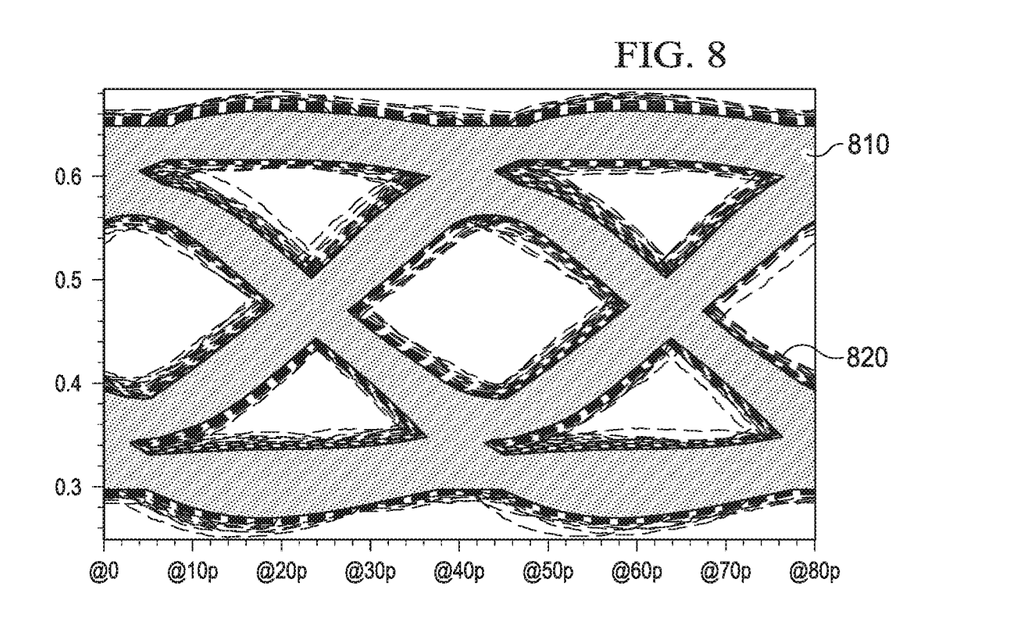

FIGS. 6-8 illustrate the results of simulating the operation of TIA 200. The target speed of the simulation is 25 Gbps. An ideal current source with low level of 3 µA and a high level of 27 µA is adopted to mimic the output of a photodiode, which is about −15 dBm with a 0.7 A/W reproductivity. Total capacitance $C_{RX}$ of 112 fF is used for covering the parasitic with the photodiode, bump, wiring and receiver frontend. Six graphs are shown in FIG. 6 with each graph having a y-axis of feedback capacitance values in fF and an x-axis in shunt capacitor values in fF.

With all other settings fixed, $C_{SH}$ and $C_{FB}$ are swept in 2D manner in the simulation to find the best setting globally. AC noise simulation is run to characterize bandwidth with noise performance and transient simulation is run to characterize the main tap, pre-/post-cursors, eye opening after ISI and $10^{-12}$ BER eye opening after ISI and noise. The results at v(mid$_3$) of the data path 210 are presented. The same conclusions can be drawn to other nodes, such as v(mid$_1$) and v(mid$_2$) of the data path 210.

Graph 610 shows the 3 dB bandwidth from v(in) to v(mid3) increases with either larger $C_{SH}$ or larger $C_{FB}$, though it is less sensitive to $C_{SH}$ than $C_{FB}$. Graph 620 illustrates the total noise power increases with either $C_{SH}$ or $C_{FB}$. However, Graph 630 illustrates the ratio between noise power and 3 dB bandwidth can reduce with a higher $C_{SH}$ and increase mildly with a higher $C_{FB}$.

Graph 640 illustrates that the main tap increases with a larger $C_{SH}$ or $C_{FB}$ because of extended bandwidth as shown in Graph 610 at no cost of DC gain. Graph 650 illustrates the eye opening after considering ISI (2 pre-cursors and 12 post-cursors) in general increases with a larger $C_{SH}$ or $C_{FB}$ for the same reason. Furthermore, after considering noise, Graph 660 illustrates that for one example the optimal setting of $C_{SH}$ and $C_{FB}$ are 12.5 fF and 1.5 fF, respectively. Simulation of other corners reveals similar conclusions.

Comparison between a conventional TIA and TIA 200 with transient simulation over a pseudo random binary sequence (PRBS) bit stream is shown in FIG. 7. FIG. 7 illustrates a simulated eye diagram 710 of a conventional TIA and a simulated eye diagram 720 of TIA 200. The y-axis is amplitude and the x-axis is time in picoseconds. For the conventional TIA, there is no biasing path, $C_{SH}$ is set to zero, and $C_{FB}$ is also set to zero. For the TIA 200, $C_{SH}$ is set to 10 fF, $C_{FB}$ is set to 1 fF, and input DC current is 15 uA. The bias path 250 removes input DC current without much disturbance to the eye diagram 720. The two simulated circuits share the same DC gain, which is indicated by the upper and bottom envelops in FIG. 7. However, the eye diagram 720 of TIA 200 enjoys much larger bandwidth and yields much wider eye opening.

The impact of noise over the TIA 200 is shown in FIG. 8. FIG. 8 illustrates a simulation of the eye diagram 810 of TIA 200 without noise (62.5 k bit) and the eye diagram 820 with noise (10 k bit, ~7.5 σ). For FIG. 8, the y-axis is amplitude and the x-axis is time in picoseconds. With noise, the eye opening is slightly reduced, which is consistent with FIG. 6.

The TIA disclosed herein can be employed with a processor, such as a CPU or GPU, and can be integrated on the same chip with various other components to form a package, such as a CPU or GPU package, or can be located off-chip and connected to other components. The disclosed TIA can be part of an optical communication system employed in various applications, including communicating data between devices of a data center.

The TIA can employed with GPUs, which can be embodied on a single semiconductor substrate, included in a system with one or more other devices such as additional GPUs, a memory, and a CPU. The GPUs may be included on a graphics card that includes one or more memory devices and is configured to interface with a motherboard of a computer. The GPUs may be integrated GPUs (iGPUs) that are co-located with a CPU on a single chip.

The processors or computers can be part of GPU racks located in a data center. The GPU racks can be high-density (HD) GPU racks that include high performance GPU compute nodes and storage nodes. The high performance GPU compute nodes can be servers designed for general-purpose computing on graphics processing units (GPGPU) to accelerate deep learning applications. For example, the GPU compute nodes can be servers of the DGX product line from Nvidia Corporation of Santa Clara, Calif.

The compute density provided by the HD GPU racks is advantageous for AI computing and GPU data centers directed to AI computing. The HD GPU racks can be used with reactive machines, autonomous machines, self-aware machines, and self-learning machines that all require a massive compute intensive server infrastructure. For example, the GPU data centers employing HD GPU racks can provide the storage and networking needed to support large-scale deep neural network (DNN) training, such as for the NNs disclosed herein.

Various aspects of the disclosure can be claimed including the aspects as noted in the summary. Each of the aspects noted in the summary may have one or more of the elements of the dependent claims presented below in combination.

Those skilled in the art to which this application relates will appreciate that other and further additions, deletions, substitutions and modifications may be made to the described embodiments.

What is claimed is:

1. A transimpedance amplifier (TIA), comprising:
   a biasing path; and
   a data path, coupled to the biasing path, including multiple inverter stages and at least one feedback capacitance coupled across an even number of the multiple inverter stages, wherein alternating ones of the multiple inverter stages include feedback impedance, and each of the feedback impedances includes multiple feedback resistors coupled in series and at least one shunt capacitor coupled between the multiple feedback resistors.

2. The TIA as recited in claim 1, wherein a number of the multiple feedback resistors coupled in series is two.

3. The TIA as recited in claim 1, wherein the data path includes at least three inverter stages and multiple feedback capacitances, wherein a different one of the feedback capacitances is coupled across a different even numbered combination of the at least three inverter stages.

4. The TIA as recited in claim 3, wherein the at least three inverter stages are coupled in series and alternating ones of the at least three inverter stages include a feedback impedance having multiple feedback resistors coupled in series and a shunt capacitor coupled between the multiple feedback resistors.

5. The TIA as recited in claim 1, wherein the data path includes a first, a second, and a third inverter stage, a first feedback capacitance coupled across the first and the second inverter stages, a second feedback capacitance coupled across the second and the third inverter stages, and each of the first and the third inverter stages include a feedback impedance, wherein each of the feedback impedances for the first and the third inverters include at least two feedback resistors coupled in series and at least one shunt capacitor coupled between the two feedback resistors.

6. A circuit, comprising:
   a processor, and
   a transimpedance amplifier (TIA), coupled to the processor, including a data path having multiple inverter stages and at least one feedback capacitance coupled across an even number of the multiple inverter stages, wherein alternating ones of the multiple inverter stages include a feedback impedance having multiple feedback resistors coupled in series and a shunt capacitor coupled between the multiple feedback resistors.

7. The circuit as recited in claim 6, further comprising a bus, wherein the TIA is coupled to the processor via the bus.

8. The circuit as recited in claim 7, further comprising a sensing amplifier and a deserializer, wherein the sensing amplifier is coupled to an output of the TIA, the deserializer is coupled to an output of the sensing amplifier and the bus, and the processor is coupled to the bus.

9. The circuit as recited in claim 6, wherein the circuit is located on a single chip.

10. The circuit as recited in claim 9, wherein the processor is a graphics processing unit.

11. The circuit as recited in claim 6, wherein the data path includes at least three inverter stages and multiple feedback capacitances, wherein a different one of the feedback capacitances is coupled across a different even numbered combination of the at least three inverters.

12. An optical receiver, comprising:
    a photodetector; and a transimpedance amplifier (TIA) coupled to the photodetector and including a data path having multiple inverter stages and at least one feedback capacitance coupled across an even number of the multiple inverter stages, wherein alternating ones of the multiple inverter stages include a feedback impedance having multiple feedback resistors coupled in series and a shunt capacitor coupled between the multiple feedback resistors.

13. The optical receiver as recited in claim 12, further comprising an optical waveguide coupled to the photodetector, wherein the photodetector receives light from the waveguide and converts the light to an electrical current that is received by the TIA.

14. The optical receiver as recited in claim 12, wherein the data path includes at least three inverters and multiple feedback capacitances, wherein a different one of the feedback capacitances is coupled across a different even numbered combination of the at least three inverters.

15. The optical receiver as recited in claim 12, wherein the photodetector and the TIA are located on a single chip.

16. A method of operating an optical receiver having a transimpedance amplifier (TIA), comprising:
  receiving optical data;
  converting the optical data to an electrical current;
  reducing a DC component of the electrical current employing a biasing path of the TIA;
  converting the electrical current to an electrical voltage employing the TIA, wherein the converting includes extending a bandwidth of the TIA and increasing a signal to noise ratio of the TIA employing feedback impedance, and further increasing the bandwidth of the TIA employing feedback capacitance.

* * * * *